United States Patent
Doherty et al.

(10) Patent No.: US 6,466,047 B1
(45) Date of Patent: *Oct. 15, 2002

(54) SYSTEM FOR TESTING BUMPED SEMICONDUCTOR COMPONENTS WITH ON-BOARD MULTIPLEX CIRCUIT FOR EXPANDING TESTER RESOURCES

(75) Inventors: C. Patrick Doherty, Boise, ID (US); Jorge L. deVarona, Boise, ID (US); Salman Akram, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/999,502

(22) Filed: Dec. 4, 2001

Related U.S. Application Data

(60) Division of application No. 09/675,072, filed on Sep. 28, 2000, now Pat. No. 6,433,574, which is a division of application No. 09/244,373, filed on Feb. 4, 1999, now Pat. No. 6,337,577, which is a continuation-in-part of application No. 09/075,691, filed on May 11, 1998, now Pat. No. 6,246,250.

(51) Int. Cl.⁷ .................................................. G01R 31/26
(52) U.S. Cl. ...................................... 324/765; 324/158.1
(58) Field of Search ............................... 324/765, 158.1, 324/754, 755, 757, 758

(56) References Cited

U.S. PATENT DOCUMENTS

| | | |
|---|---|---|
| 3,806,801 A | 4/1974 | Bove |
| 4,027,935 A | 6/1977 | Byrnes et al. |
| 4,585,991 A | 4/1986 | Reid et al. |
| 4,891,585 A | 1/1990 | Janko et al. |
| 4,906,920 A | 3/1990 | Huff et al. |
| 4,918,383 A | 4/1990 | Huff et al. |
| 4,954,458 A | 9/1990 | Reid |
| 5,042,148 A | 8/1991 | Tada et al. |
| 5,053,700 A | 10/1991 | Parrish |
| 5,055,780 A | 10/1991 | Takagi et al. |

(List continued on next page.)

*Primary Examiner*—Michael Sherry
*Assistant Examiner*—Jimmy Nguyen
(74) *Attorney, Agent, or Firm*—Stephen A. Gratton

(57) ABSTRACT

An interconnect, a test system, and a test method for testing bumped semiconductor components, such as dice and packages, contained on substrates, such as wafers or panels, are provided. The test system includes the interconnect, a tester for generating test signals, and a wafer prober for placing the components and interconnect in physical contact. The interconnect includes interconnect contacts, such as conductive pockets, for electrically engaging bumped component contacts on the components. The interconnect also includes an on board multiplex circuit adapted to fan out and selectively transmit test signals from the tester to the interconnect contacts. The multiplex circuit expands tester resources by allowing test signals to be written to multiple components in parallel. Reading of the test signals from the components can be performed in groups up to the limit of the tester resources. In addition to expanding tester resources, the multiplex circuit maintains the individuality of each component, and permits defective components to be electrically disconnected.

26 Claims, 7 Drawing Sheets

U.S. PATENT DOCUMENTS

| | | |
|---|---|---|
| 5,070,297 A | 12/1991 | Kwon et al. |
| 5,103,557 A | 4/1992 | Leedy |
| 5,124,639 A | 6/1992 | Carlin et al. |
| 5,172,050 A | 12/1992 | Swapp |
| 5,177,439 A | 1/1993 | Liu et al. |
| 5,180,977 A | 1/1993 | Huff |
| 5,196,726 A | 3/1993 | Nishiguichi et al. |
| 5,225,037 A | 7/1993 | Elder et al. |
| 5,264,787 A | 11/1993 | Woith et al. |
| 5,323,107 A | 6/1994 | D'Souza |
| 5,329,423 A | 7/1994 | Scholz |
| 5,475,317 A | 12/1995 | Smith |
| 5,477,160 A | 12/1995 | Love |
| 5,483,741 A | 1/1996 | Akram et al. |
| 5,491,427 A | 2/1996 | Ueno et al. |
| 5,500,605 A | 3/1996 | Chang |
| 5,592,736 A | 1/1997 | Akram et al. |
| 5,625,298 A | 4/1997 | Hirano et al. |
| 5,686,317 A | 11/1997 | Akram et al. |
| 5,736,850 A | 4/1998 | Legal |
| 5,789,271 A | 8/1998 | Akram |
| 5,834,945 A | 11/1998 | Akram et al. |
| 5,869,974 A | 2/1999 | Akram et al. |
| 5,915,977 A | 6/1999 | Hembree et al. |
| 5,962,921 A | 10/1999 | Farnworth et al. |
| 6,016,060 A | 1/2000 | Akram et al. |
| 6,040,702 A | 3/2000 | Hembree et al. |
| 6,060,891 A | 5/2000 | Hembree et al. |
| 6,072,321 A | 6/2000 | Akram et al. |
| 6,078,186 A | 6/2000 | Hembree et al. |
| 6,091,252 A | 7/2000 | Akram et al. |
| 6,107,109 A | 8/2000 | Akram et al. |
| 6,127,736 A | 10/2000 | Akram |
| 6,181,144 B1 | 1/2001 | Hembree et al. |
| 6,188,232 B1 | 2/2001 | Akram et al. |
| 6,204,678 B1 | 3/2001 | Akram et al. |
| 6,208,157 B1 | 3/2001 | Akram et al. |
| 6,218,848 B1 | 4/2001 | Hembree et al. |
| 6,229,324 B1 | 5/2001 | Akram et al. |
| 6,232,243 B1 | 5/2001 | Farnworth et al. |
| 6,239,590 B1 | 5/2001 | Krivy et al. |
| 6,242,935 B1 | 6/2001 | Akram |
| 6,246,245 B1 | 6/2001 | Akram et al. |
| 6,246,250 B1 * | 6/2001 | Doherty et al. ............. 324/765 |
| 6,261,854 B1 | 7/2001 | Akram et al. |
| 6,275,052 B1 | 8/2001 | Hembree et al. |
| 6,294,837 B1 | 9/2001 | Akram et al. |
| 6,300,786 B1 * | 10/2001 | Doherty et al. ............. 324/765 |

* cited by examiner

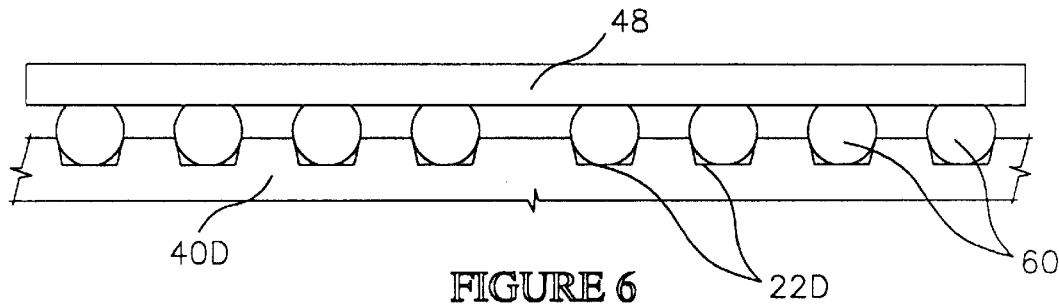

FIGURE 6

```
PLACE CONTACTS 22 ON INTERCONNECT 20
IN ELECTRICAL COMMUNICATION
WITH BUMPED COMPONENT CONTACTS 12
ON COMPONENTS 11 (DEVICES UNDER TEST).
```

```
TEST THE COMPONENTS 11 IN GROUPS FOR
OPENS AND SHORTS BY SELECTIVELY
ACTUATING CONTACTS 22 ON
THE INTERCONNECT 20 UP TO LIMIT
OF TESTER RESOURCES.
```

```
DISABLE DEFECTIVE COMPONENTS 11 BY
SELECTIVELY ACTUATING CONTACTS 22
ON THE INTERCONNECT 20.
```

```
WRITE TEST SIGNALS FROM TESTER 26 TO
MULTIPLE COMPONENTS 11 BY
MULTIPLEXING INPUT TEST SIGNALS TO
SELECTED CONTACTS 22 AND BUMPED
COMPONENT CONTACTS 12 ON MULTIPLE
COMPONENTS 11 AT THE SAME TIME.
```

```
READ TEST SIGNALS FROM MULTIPLE
COMPONENTS 11 IN GROUPS UP TO LIMIT OF
TESTER RESOURCES, WHILE MAINTAINING
COMPONENT UNIQUENESS AND ABILITY TO
DISCONNECT DEFECTIVE COMPONENTS 11.
```

FIGURE 7

SYSTEM FOR TESTING BUMPED SEMICONDUCTOR COMPONENTS WITH ON-BOARD MULTIPLEX CIRCUIT FOR EXPANDING TESTER RESOURCES

CROSS REFERENCE TO RELATED APPLICATIONS

This application is a division of U.S. patent application Ser. No. 09/675,072, now U.S. Pat. No. 6,433,574 filed on Sep. 28, 2000, which is a division of U.S. patent application Ser. No. 09/244,373, filed on Feb. 4, 1999, U.S. Pat. No. 6,337,577, which is a continuation-in-part of U.S. patent application Ser. No. 09/075,691, filed on May 11, 1998, U.S. Pat. No. 6,246,250 B1.

FIELD OF THE INVENTION

This invention relates generally to semiconductor manufacture, and specifically to an interconnect and system for testing bumped semiconductor components, such as bumped semiconductor dice contained on wafers, or bumped semiconductor packages contained on panels. This invention also relates to test systems and test methods employing the interconnect.

BACKGROUND OF THE INVENTION

Semiconductor components, such as dice, wafers, chip scale packages, and BGA devices can include terminal contacts in the form of bumps, or balls. This type of component is sometimes referred to as a "bumped" component, and the terminal contacts are sometimes referred to as "bumped contacts".

The bumped contacts provide a high input/output capability for a component, and permit the component to be surface mounted, or alternately flip chip mounted, to a mating substrate, such as a printed circuit board (PCB). Typically, the bumped contacts comprise solder balls, which permits bonding to the mating substrate using a solder reflow process. For some components, such as chip scale packages and BGA devices, the balls can be arranged in a dense array, such as a ball grid array (BGA), or a fine ball grid array (FBGA).

Bumped components are often manufactured using wafer level processes wherein multiple components are fabricated on a substrate, which is then singulated into individual components. Bumped semiconductor dice, for example, can be fabricated on silicon wafers which are then singulated into individual bumped dice. Chip scale packages can also be fabricated using a wafer, or a panel of material, such as silicon, ceramic, or a glass filled resin.

The wafer level fabrication processes also require wafer level testing procedures, in which temporary electrical connections are made with the bumped contacts, and test signals are transmitted to the integrated circuits contained on the components. The testing procedures can be performed using a test system in which an interconnect component of a test system, such as a probe card, makes the temporary electrical connections with the components. For example, a typical wafer level test system for testing semiconductor wafers includes a wafer prober for handling and positioning the wafers, a tester for generating and analyzing test signals, a probe card for making temporary electrical connections with the wafer, and a prober interface board for routing test signals from the tester pin electronics to the probe card.

There are several problems associated with wafer level testing of bumped components. Firstly, the interconnect must make low resistance electrical connections with the bumped contacts, which requires penetration of oxide layers on the contacts. However, bumped contacts are easily deformed, making low resistance connections difficult to make without deforming the bumped contacts. In general, deformed contacts present cosmetic and performance problems in the completed components.

In addition, the bumped contacts are typically contained in dense arrays, such that a substrate, can include thousands of bumped contacts. During testing procedures, it is difficult to physically and electrically contact large numbers of bumped contacts with conventional interconnects, such as probe cards. In addition, the testers associated with the test systems may not have sufficient resources to simultaneously generate and analyze test signals for large numbers of bumped contacts.

The present invention is directed to an interconnect and test system for wafer level testing of bumped components, capable of making reliable electrical connections with dense arrays of bumped contacts. In addition, the interconnect on-board multiplex circuitry configured to expand the resources of a tester of the test system during test procedures.

SUMMARY OF THE INVENTION

In accordance with the present invention, an interconnect for testing bumped semiconductor components contained on a component substrate, such as a wafer, or a panel of material, is provided. Also provided is a test system which includes the interconnect, and a tester for generating test signals and analyzing the resultant signals.

The interconnect includes a substrate, and contacts on the substrate for making temporary electrical connections with bumped contacts on the components. Several different embodiments for the interconnect contacts are provided. In a first embodiment, the interconnect contacts comprise conductive pockets sized and shaped to retain and electrically engage the bumped contacts. In a second embodiment, the interconnect contacts comprise conductive pockets having blades for penetrating the bumped contacts. In a third embodiment, the interconnect contacts comprise penetrating projections projecting from a surface of the interconnect substrate. In a fourth embodiment, the interconnect contacts comprise conductive pockets formed on an elastomeric layer.

In addition to the interconnect contacts, the interconnect includes an on board multiplex circuit adapted to fan out, and selectively transmit, test signals from the tester to the contacts in response to control signals. The multiplex circuit includes integrated circuitry and active electrical switching devices, such as FETs, operable by control signals generated by a controller. With the interconnect substrate comprising a semiconducting material, the active electrical switching devices, can be formed directly on the interconnect substrate, using semiconductor circuit fabrication techniques. Alternately, the multiplex circuit can be contained on a die physically and electrically attached to the interconnect, or on an interposer attached to the interconnect.

The interconnect can be configured to electrically engage one component, or multiple components at the same time, up to all of the components contained on the component substrate. Each interconnect contact can be enabled or disabled as required by the multiplex circuit, to selectively write (send) the test signals to the components, and to selectively read (receive) output signals from the components. In addition, the multiplex circuit allows tester resources to be fanned out to multiple components under test, while maintaining the uniqueness of each component, and the ability to disconnect failing components. The additional control of the test signals also speeds up the testing process, and allows higher wafer throughputs using the same tester resources.

A test procedure conducted with the test system includes the step of testing the bumped components for opens and shorts in groups corresponding to the available tester resources. Next, multiple components can be written to in parallel by multiplexing drive only and I/O resources of the tester. Following the write step, multiple components can be read in parallel in groups corresponding to the available tester drive only and I/O resources.

BRIEF DESCRIPTION OF THE DRAWINGS

FIG. 6 is a schematic cross sectional view taken along section line 6—6 of FIG. 4A illustrating a bumped semiconductor die containing multiplex circuitry flip chip mounted to the interconnect of FIG. 4A;

FIG. 7 is a block diagram illustrating steps in a method for testing semiconductor components in accordance with the invention;

DETAILED DESCRIPTION OF THE PREFERRED EMBODIMENTS

Referring to FIGS. 1A–1C, and 2A–2B, various prior art substrates containing bumped semiconductor components are illustrated. As will be further explained, an interconnect and test system can be constructed in accordance with the invention for testing each of the substrates, as well as other types of substrates, which contain bumped semiconductor components.

Figure 1A:
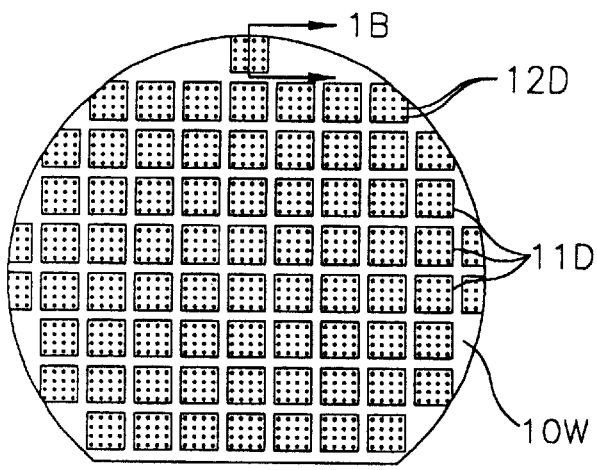
FIG. 1A is a schematic plan view of a prior art component substrate in the form of a semiconductor wafer containing multiple semiconductor dice.
Figure 1B:
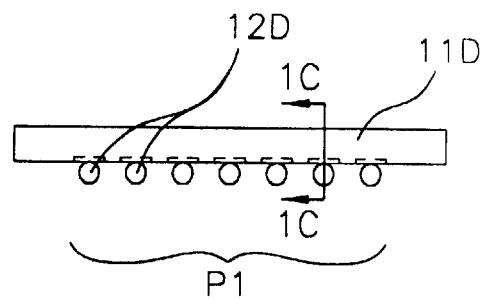
FIG. 1B is an enlarged cross sectional view taken along section line 1B—1B of FIG. 1A illustrating a bumped semiconductor die on the wafer.

In FIG. 1A, a substrate comprises a semiconductor wafer 10W containing a plurality of components in the form of semiconductor dice 11D. Typically, the semiconductor wafer 10W comprises a semiconducting material such as silicon or gallium arsenide. FIG. 1B illustrates a die 11D that has been separated from the wafer 10W. The die 11D includes an array of bumped component contacts 12D, such as solder balls, formed on a face thereof. The bumped component contacts 12D are formed in a pattern P1, such as a dense ball grid array (BGA).

Figure 1C:
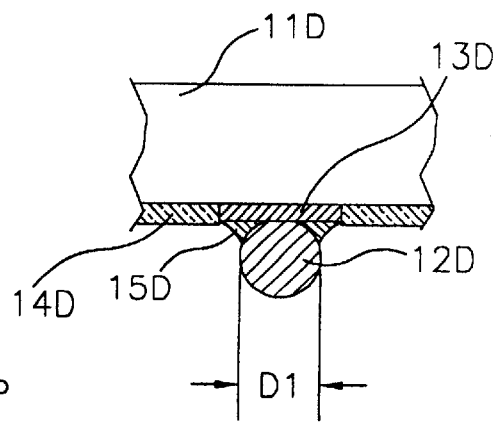
FIG. 1C is an enlarged cross sectional view taken along section line 1C—1C of FIG. 1B illustrating a bumped contact on the die.

As shown in FIG. 1C, the bumped component contacts 12D are bonded to planar bond pads 13D on the die 11D in electrical communication with the integrated circuits contained on the die 11D. In addition, the bond pads 13D are surrounded by a die passivation layer 14D formed on the face of the die 11D. As also shown in FIG. 1C, solder fillets 15D attach the bumped component contacts 12D to the bond pads 13D.

Figure 2A:
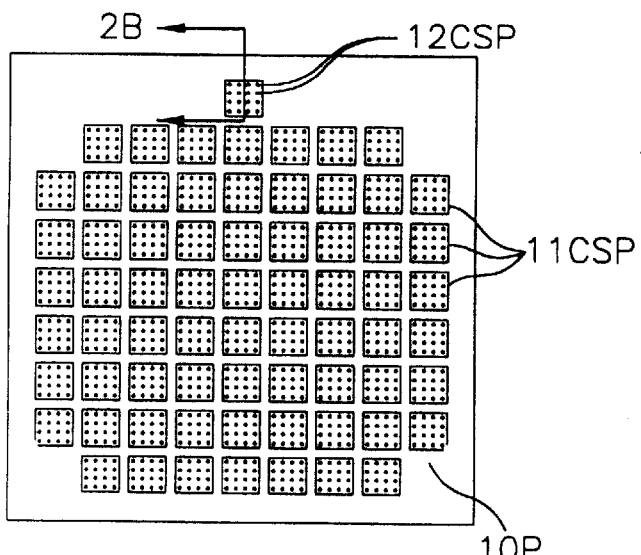
FIG. 2A is a schematic plan view of a prior art component substrate in the form of a panel containing multiple semiconductor packages.

Referring to FIG. 2A, a substrate comprises a panel 10P containing a plurality of semiconductor components in the form of chip scale packages 11CSP. Typically, the panel 10P comprises an electrically insulating material such as ceramic, a reinforced polymer laminate, such as bismaleimide triazine (BT), or an epoxy resin (e.g., FR-4).

Figure 2B:
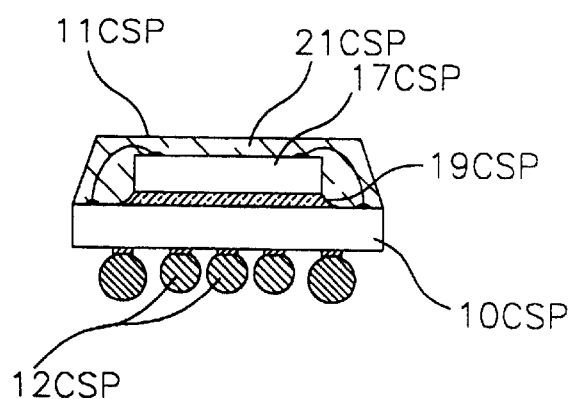
FIG. 2B is an enlarged cross sectional view taken along section line 2B—2B of FIG. 2A illustrating a semiconductor package on the panel.

As shown in FIG. 2B, each chip scale package 11CSP includes a substrate 10CSP. The substrate 10CSP comprises a segment of the panel 10P which has been cut, sheared, punched or otherwise separated from a remainder of the panel 10P. In addition, each chip scale package 11CSP includes a semiconductor die 17CSP wire bonded to the substrate 10CSP, an adhesive layer 19CSP which attaches the die 17CSP to the substrate 10CSP, and an encapsulating resin 21CSP encapsulating the die 17CSP. Each chip scale package 11CSP also includes an array of bumped component contacts 12CSP in electrical communication with the integrated circuits contained on the die 17CSP.

The bumped component contacts 12CSP are formed on the substrate 10CSP in a dense grid array, such as a ball grid array (BGA), or a fine ball grid array (FBGA). By way of example, a representative diameter D1 for the bumped component contacts 12CSP can be about 0.005-in (0.127 mm) to 0.050-in (1.270 mm) or greater. A representative pitch P (center to center spacing) of the bumped component contacts 12CSP can be from about 0.008-in (0.228 mm) to about 0.060-in (1.524 mm) or greater.

Figure 3:
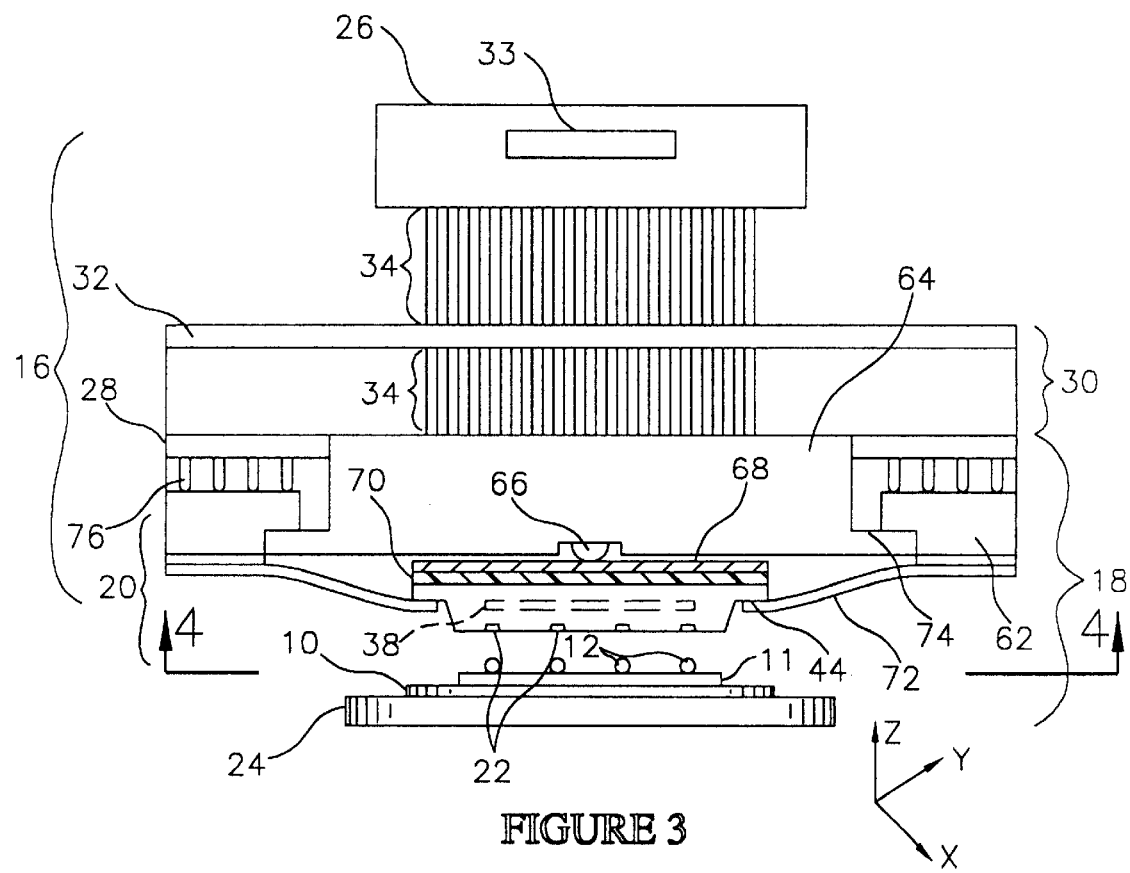
FIG. 3 is a schematic cross sectional view of a test system constructed in accordance with the invention for testing components contained on a component substrate.

Referring to FIG. 3, a test system 16 constructed in accordance with the invention, and configured to test components 11 contained on a substrate 10 is illustrated. For simplicity, only a single component 11 is illustrated on the substrate 10. However, in actual practice the substrate 10 will contain multiple components 11, similarly to the wafer 10W (FIG. 1A), or the panel 10P (FIG. 2A), previously described. The components 11 on the substrate 10 include patterns of bumped component contacts 12 in electrical communication with integrated circuits and other electrical elements on the components 11.

The test system 16 includes a test head 30 and an interconnect 20. The interconnect 20 includes patterns of interconnect contacts 22 configured to make temporary electrical connections with the bumped component contacts 12. The test system 16 also includes a wafer prober 18 wherein the interconnect 20 is mounted, and a tester 26 configured to apply test signals through the interconnect 20, to the components 11 contained on the substrate 10, and to analyze the resultant signals. The wafer prober 18 includes an interconnect holder 62 for mounting and electrically interfacing with the interconnect 20. Further details of mounting the interconnect 20 to the test head 30 will be hereinafter described.

The wafer prober 18 also includes a wafer chuck 24 configured to move in X and Y directions to align the substrate 10 with the interconnect 20, and in the Z direction to move the substrate 10 into contact with the interconnect 20. One suitable wafer prober 18 is manufactured by Electroglass and is designated a Model 4080.

The test system 16 also includes a prober interface board 28 for routing test signals from the test head 30 to the interconnect 20. In addition, the prober interface board 28 can be in electrical communication with tester pin electronics 32 in the test head 30. The tester pin electronics 32 provide separate electrical paths 34 from test circuitry 33 contained in the tester 26, to the test head 30 and to the prober interface board 28.

The signal generating and analyzing capability of the test circuitry 33, and the number of separate electrical paths 34 provided by the tester pin electronics 32, are termed herein as "tester resources". In general, the configurations of the test circuitry 33, and of the electrical paths 34, are fixed for a particular tester 26 by the manufacturer. For example, the test circuitry 33 can be configured to route drive only signals through some of the electrical paths 34, and input/output channels through other of the electrical paths 34, as required for testing a particular type of die 12. Exemplary testers 26 are commercially available from Teradyne of Boston, Mass., as well as other manufacturers.

Figure 4:
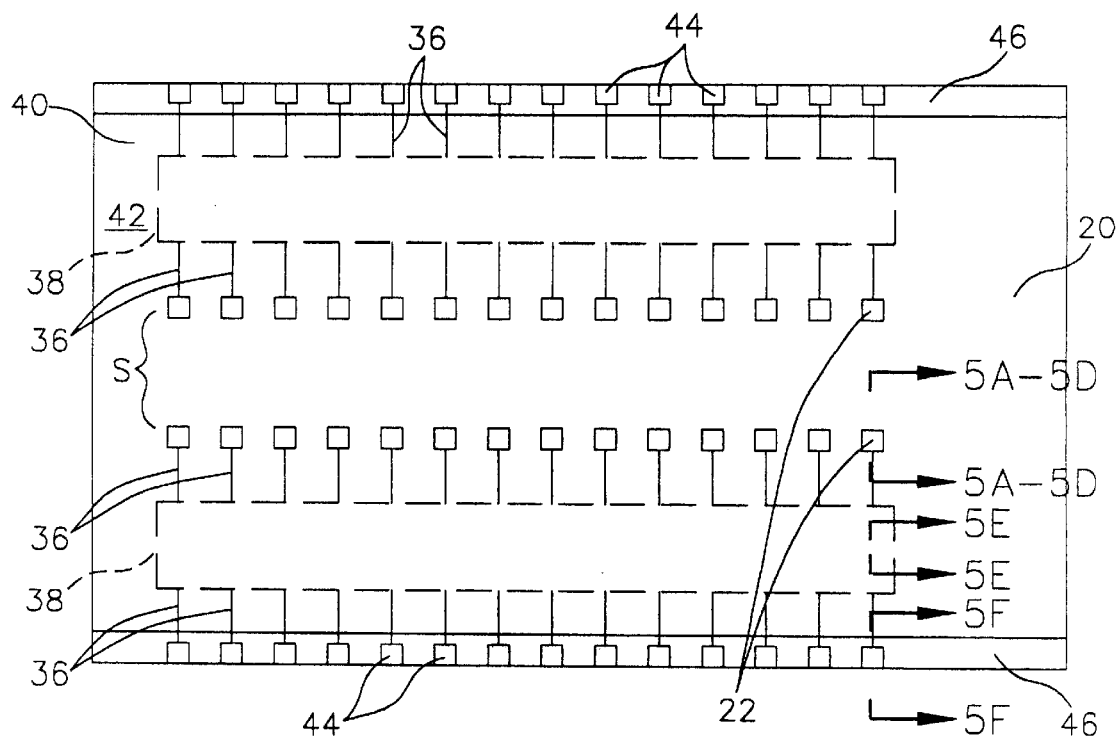
FIG. 4 is an enlarged schematic plan view taken along section line 4—4 of FIG. 3 and rotated 90°, illustrating an interconnect constructed in accordance with the invention.

Referring to FIG. 4, further details of the interconnect 20 are illustrated. The interconnect contacts 22 are arranged in patterns corresponding to the patterns of the bumped component contacts 12. Each pattern of interconnect contacts 22 represents a single test site (S). For simplicity, only one pattern of interconnect contacts 22 and one test site (S) on the interconnect 20 is illustrated. However, in actual practice, the interconnect 20 can include multiple patterns of interconnect contacts 22 forming multiple test sites (S1 . . . Sn) to accommodate testing of multiple components 11 at the same time.

In order to test multiple components 11 at the same time, certain conditions must be met. Firstly, the patterns of interconnect contacts 22 must exactly match the patterns of the bumped component contacts 12. In addition, the stepping distance (i.e., x-y repeat and pattern spacing) must be the same for the interconnect contacts 22 as for the bumped component contacts 12. Secondly, the software that controls the stepping process must be able to pick valid test sites. For example, when testing at the edges of a round wafer with an interconnect that includes rectangular or square patterns of interconnect contacts 22, some patterns of interconnect contacts 22 will not have an associated component under test.

In general, the use of the interconnect 20 can greatly reduce the number of steps necessary for the prober 18 to test all of the components 11 contained on the substrate 10. In the extreme case, rather than using stepping methods, the interconnect 20 can be formed with enough patterns of interconnect contacts 22 to simultaneously contact every bumped component contact 12 for all of the components 11 on the substrate 10. Test signals can then be selectively applied and electronically switched as required, to selected components 11 on the substrate 10. The interconnect 20 can be formed with any desired number of test sites (S1 . . . Sn).

Still referring to FIG. 4, in addition to the patterns of interconnect contacts 22, the interconnect 20 includes patterns of conductors 36 in electrical communication with the interconnect contacts 22 and with on-board circuitry 38. The interconnect contacts 22 and conductors 36 are formed on a substrate 40 of the interconnect 20.

In the embodiment illustrated in FIG. 4, the interconnect substrate 40 comprises silicon (or another semiconducting material such as gallium arsenide). This permits the on-board circuitry 38 to be formed as integrated circuits on the interconnect substrate 40 using semiconductor circuit fabrication techniques such as doping, CVD, photolithography, and etching. Also, with the interconnect substrate 40 comprising silicon, a coefficient of thermal expansion of the interconnect 20 exactly matches that of the substrate 10. The interconnect substrate 40 can also comprise a silicon containing material, such as silicon-on-glass, and the on board circuitry can be formed on a layer of the interconnect substrate 40.

Preferably, the interconnect substrate 40 is thick enough to resist deflection and buckling during test procedures using the interconnect 20. In addition, an electrically insulating layer 42, such as $SiO_2$, polyimide, or BPSG can be formed on the substrate 40 to provide insulation for the interconnect contacts 22 and conductors 36 from the bulk of the interconnect substrate 40.

The conductors 36 on the substrate 40 are in electrical communication with the interconnect contacts 22, and with the on board circuitry 38. The conductors 36 can be formed on a surface of the substrate 40 in a required pattern. In addition, the conductors 36 can include interlevel segments, such as metal vias or other interlevel electrical paths, that are in electrical communication with other components of the on-board circuitry 38.

In addition, the conductors 36 can be placed in electrical communication with the test circuitry 33 (FIG. 3) to provide electrical paths from the test circuitry 33 to the on-board circuitry 38, and to the interconnect contacts 22. Preferably, the conductors 36 comprise a highly conductive metal such as copper, aluminum, titanium, tantalum, tungsten, molybdenum or alloys of these metals. The conductors 36 can be formed as a single layer of metal, or as a multi metal stack, using a thin film metallization process (e.g., CVD, patterning, etching). Alternately, a thick film metallization process (e.g., screen printing, stenciling) can be used to form the conductors 36.

The conductors 36 also include bonding pads 44 located along the peripheral edges of the interconnect 20. The bonding pads 44 provide bonding sites for forming separate electrical paths from the interconnect holder 62 (FIG. 1) to each of the conductors 36. Preferably the bonding pads 44 are located on recessed surfaces 46 (FIG. 5F) along the edges of the interconnect substrate 40 to provide clearance for TAB bonds, wire bonds, spring loaded connectors (e.g., "POGO PINS") or other electrical connections to the bonding pads 44.

Figure 5A:
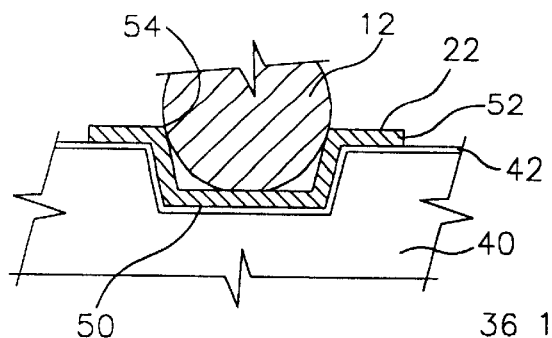
FIG. 5A is an enlarged cross sectional view taken along section line 5A—5A of FIG. 4, following contact of the interconnect and component, and illustrating a first embodiment interconnect contact electrically engaging a component contact.

Referring to FIG. 5A, an interconnect contact 22 is illustrated in greater detail. The interconnect contact 22 includes a conductive pocket 50 formed in the interconnect substrate 40, and a conductive layer 52 formed on the pocket 50. The pocket 50 can be etched by forming a mask (not shown) on the interconnect substrate 40, such as a photopatterned resist mask, and then etching the interconnect substrate 40 through openings in the mask, using an etchant. With the interconnect substrate 40 comprising silicon, a suitable etchant for performing the etch process comprises a solution of KOH.

A size and shape of the pocket 50 will be determined by the openings in the etch mask used to etch the interconnect substrate 40. The pocket 50 is sized and shaped to retain and electrically engage the bumped component contact 12. A representative diameter, or width, of the pocket 50 can be from 2 mils to 50 mils or more. This diameter can be less than a diameter of the bumped component contact 12 so that only portions of the bumped component contact 12 will be contacted. A depth of the pocket 50 can be equal to or less than the diameter of the pocket 50. A pitch or spacing of the pocket 50 relative to adjacent pockets 50 on the interconnect 20 will exactly match a pitch or spacing of the component contacts 12 on the component 11.

Still referring to FIG. 5A, the conductive layer 52 can comprise a layer of a highly conductive metal such as aluminum, titanium, nickel, iridium, copper, gold, tungsten, silver, platinum, palladium, tantalum, molybdenum or alloys of these metals. The conductive layer 52 can be formed on the insulating layer 42 to a desired thickness using a suitable metallization process (e.g., CVD, photopatterning, etching). Peripheral edges 54 of the conductive layer 52 are adapted to penetrate native oxide layers on the bumped component contacts 12 to contact the underlying metal.

In addition, the conductive layer 52 is in electrical communication with a selected conductor 36 (FIG. 4). The conductive layer 52 and selected conductor 36 can be formed using a same metallization process or using different metalization processes. In addition, the conductive layer 52 and conductor 36 can be formed as multi-layered stacks of metals (e.g., bonding layer/barrier layer). Still further, the conductor 36 can be electrically insulated with an outer insulating layer (not shown).

Further details of the interconnect contact 22 are described in U.S. patent application Ser. No. 08/829,193, now U.S. Pat. No. 5,962,921, entitled "INTERCONNECT HAVING RECESSED CONTACT MEMBERS WITH PENETRATING BLADES FOR TESTING SEMICONDUCTOR DICE AND PACKAGES WITH CONTACT BUMPS", incorporated herein by reference.

Figure 5B:
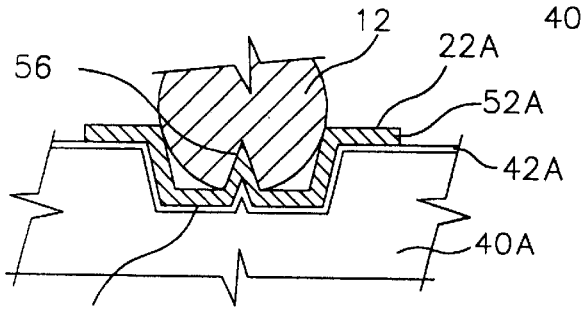
FIG. 5B is an enlarged cross sectional view equivalent to FIG. 5A illustrating a second embodiment interconnect contact electrically engaging the component contact.

Referring to FIG. 5B a second embodiment interconnect contact 22A is illustrated. The interconnect contact 22A includes a pocket 50A formed in a substrate 40A. In addition, the interconnect contact 22A includes an insulating layer 42A, and a conductive layer 52A. Each of these elements are substantially similar to the previously described elements of interconnect contact 22 (FIG. 5A).

The interconnect contact 22A also includes a penetrating blade 56 configured to penetrate into the bumped component contact 12 to form a reliable electrical connection therewith. Further details of the interconnect contact 22A are described in previously cited U.S. patent application Ser. No. 08/829, 193.

Figure 5C:
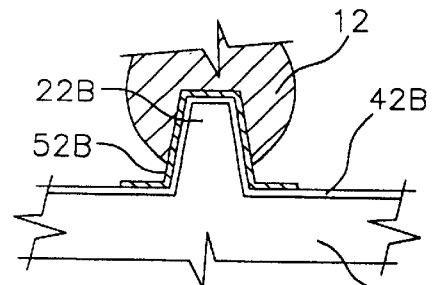
FIG. 5C is an enlarged cross sectional view equivalent to FIG. 5A illustrating a third embodiment interconnect contact electrically engaging the component contact.

Referring to FIG. 5C, a third embodiment interconnect contact 22B comprises a projection formed integrally with a substrate 40B, which preferably comprises silicon or other etchable material. One method for forming the interconnect contact 22B is by etching the substrate 40B as described in U.S. Pat. No. 5,483,741, entitled "METHOD FOR FABRICATING A SELF LIMITING SILICON BASED INTERCONNECT FOR TESTING BARE SEMICONDUCTOR DICE", which is incorporated herein by reference. The interconnect contact 22B includes a conductive layer 52B formed using a metallization process as previously described. The conductive layer 52B is in electrical communication with a selected conductor 36 on the substrate 40B. In addition, an insulating layer 42B can be formed on the substrate 40B to electrically insulate the conductive layer 52B from the bulk of the substrate 40B.

The interconnect contact 22B is adapted to penetrate into the bumped component contact 12 to form an electrical connection therewith. In FIG. 5C, the interconnect contact 22B is shown as penetrating a center of the bumped component contact 12, forming a void in the bumped component contact 12. However, penetration can be along the peripheral edges of the bumped component contact 12 in which case a groove would be formed.

Figure 5D:
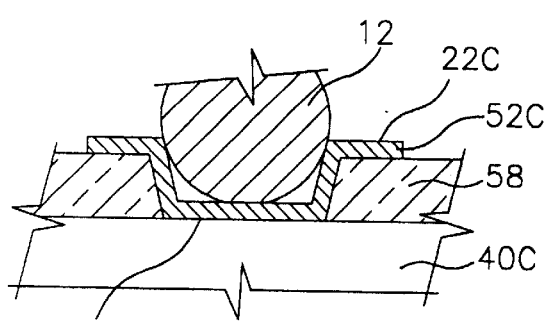
FIG. 5D is an enlarged cross sectional view equivalent to FIG. 5A illustrating a fourth embodiment interconnect contact electrically engaging the component contact.

Referring to FIG. 5D, a fourth embodiment interconnect contact 22B comprises a pocket 50C covered with a conductive layer 52C in electrical communication with a selected conductor 36, substantially as previously described. However in this embodiment, the pocket 50C is formed on an elastomeric layer 58 formed on a substrate 40C. The elastomeric layer 58 comprises a compliant polymer material that allows the interconnect contact 22B to move in the z-direction to accommodate variations in the size, location, and planarity in the bumped component contacts 12.

Suitable materials for the elastomeric layer 58 include polyimide, photoimageable polyimide, polyester, epoxy, urethane, polystyrene, silicone and polycarbonate. These materials can be cast in place to a desired thickness using known processes such as spin on, or dispensing through a nozzle. Alternately, these materials can be in the form of a tape, such as "KAPTON" tape, which can be applied to the substrate 40C using an adhesive layer. A representative thickness for the elastomeric layer 58 can be from 0.5 $\mu$m to 50 $\mu$m.

Figure 5E:
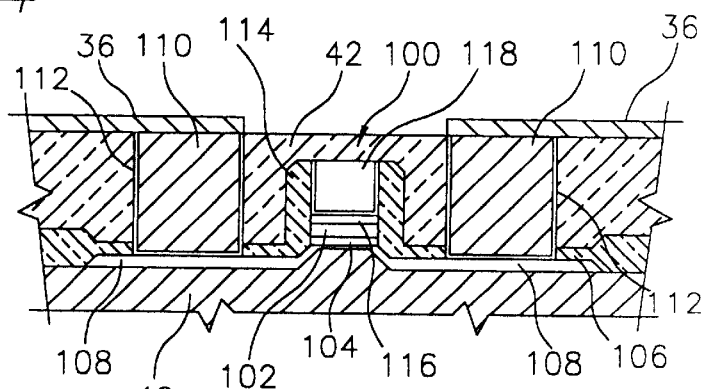
FIG. 5E is an enlarged cross sectional view taken along section line 5E—5E of FIG. 4, illustrating a FET transistor of on board mulitiplex circuitry contained on the interconnect.
Figure 5F:
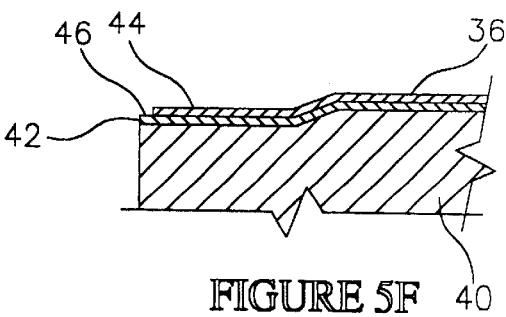
FIG. 5F is an enlarged cross sectional view taken along section line 5F—5F of FIG. 4 illustrating a bonding pad on the interconnect.

Referring to FIG. 5E, an enlarged cross sectional view of a FET transistor 100 of the on board circuitry 38 (FIG. 4) is illustrated. As is apparent the FET transistor 100 is merely one component of the on board circuitry 38. The on board circuitry 38 can include many FET transistors 100, as well as additional components, to provide the circuit arrangements that will be hereinafter explained. Further, other active electrical switching devices, such as NPN or PNP transistors can be used in place of the FET transistor 100 illustrated in the preferred embodiment.

The FET transistors 100 can be formed integrally with the substrate 40 using semiconductor circuit fabrication techniques. A suitable process sequence can include initially etching the interconnect contacts 22 (FIG. 5A) and then fabricating the FET transistors 100. Following formation of the FET transistors 100, the insulating layer 42 can be formed, the conductive layers 52 (FIG. 5A) can be formed, and the conductors 36 (FIG. 4) can be formed. Each FET transistor 100 includes a polysilicon gate 102, and a gate oxide 104. In addition, a field oxide 106 is formed on the substrate 40 for electrically isolating the FET transistors 100. The substrate 40 also includes N+ active areas 108, which can be formed by implanting dopants into the substrate 40 to form the sources and drains of the FET transistors 100. Metal filled vias 110 with metal silicide layers 112, electrically connect the sources and drains of the FET transistors 100 to the conductors 36. The FET transistors 100 also include spacers 114, TEOS layers 116 and nitride caps 118.

Figure 4A:
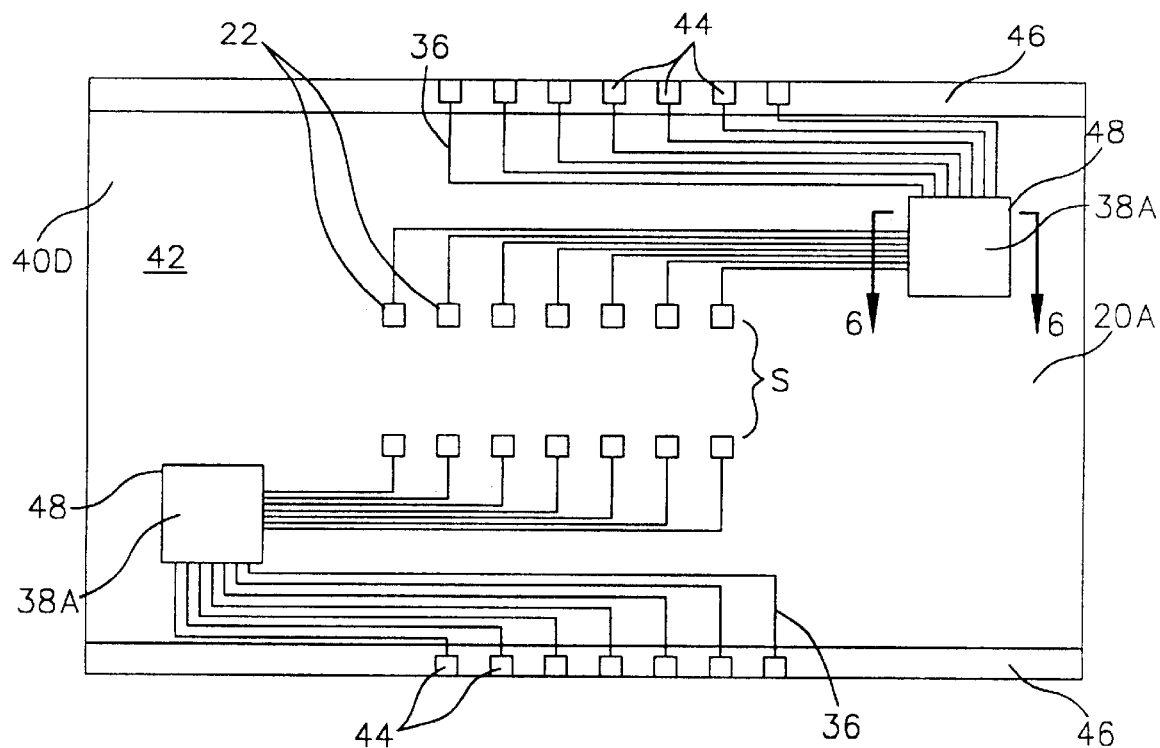
FIG. 4A is an enlarged plan view equivalent to FIG. 4 of an alternate embodiment interconnect.

Referring to FIG. 4A, an alternate embodiment interconnect 20A is illustrated. The interconnect 20A is substantially similar to the interconnect 20 previously described, but includes on board circuitry 38A formed on a die 48 mounted to a substrate 40D rather than being formed integrally therewith. In this embodiment the substrate 40 can comprise silicon, ceramic, or a glass filled resin (FR-4). Also in this embodiment, the die 48 is flip chip mounted to the substrate 40D in electrical communication with the interconnect contacts 22.

As shown in FIG. 6, the die 48 includes bumped bond pads 60. In addition, the interconnect substrate 40D includes interconnect contacts 22D configured to physically and electrically engage the bumped bond pads 60. The interconnect contacts 22D can be formed substantially as previously described for interconnect contacts 22 (FIG. 5A). The interconnect contacts 22D are in electrical communication with selected conductors 36 (FIG. 4A) on the substrate 40D. In addition, the bumped bond pads 60 can be bonded to the interconnect contacts 22D using a bonding process such as solder reflow, or by heating opposing metal surfaces. Alternately, rather than bonding the bumped bond pads 60 to the interconnect contacts 22D, the die 48 can be mechanically bonded to the substrate 40D using an encapsulant or a mechanical fixture. Further, the die 48 can be located on the substrate 40D such that the interconnect contacts 22 (FIG. 4A) electrically engage the bumped component contacts 12 (FIG. 5A) without interference from the die 48.

Figure 4B:
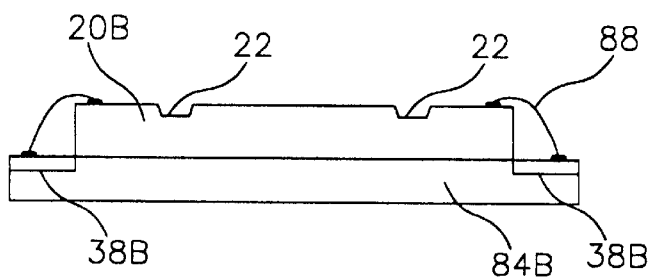
FIG. 4B is a schematic cross sectional view of another alternate embodiment interconnect.

Referring to FIG. 4B, an alternate embodiment interconnect 20B is attached to an interposer 84B, which includes on-board circuitry 38B, substantially as previously described. The interposer 84B can comprise a semiconducting material such as silicon, in which case the on-board circuitry 38B can be fabricated on the interposer 84B using semiconductor circuit fabrication techniques. Wires 88 can then be bonded to pads on the interconnect 20B and to pads on the interposer 84A to provide separate electrical paths therebetween.

Figure 4C:
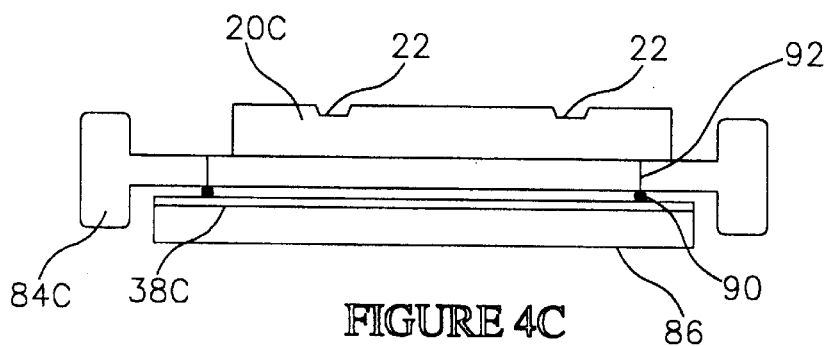
FIG. 4C is a schematic cross sectional view of another alternate embodiment interconnect.

Referring to FIG. 4C, an alternate embodiment interconnect 20C includes on-board circuitry 38C contained on a die 86 attached to an interposer 84C (or directly to the interconnect 20C). In the embodiment of FIG. 4C, the die 86 is flip chip mounted to the interposer 84C. Reflowed solder bumps 90 on the die 86 are bonded to internal conductors 92 on the interposer 84C. In addition, the internal conductors 92 are in electrical communication with the interconnect contacts 22 on the interconnect 20C.

Referring again to FIG. 3, further details of the test system 16 and interconnect 20 are illustrated. The wafer prober 18 includes the interconnect holder 62, a force applying fixture 64 and a force applying mechanism 66. These items can be components of a conventional wafer prober as previously described. The force applying mechanism 66 presses against a pressure plate 68 and a compressible member 70 to bias the interconnect 20 against the substrate 10. By way of example, the compressible member 70 can be formed of an elastomeric material such as silicone, butyl rubber, or fluorosilicone; in foam, gel, solid or molded configurations.

In addition, a flexible membrane 72 is bonded to the interconnect 20 and to the interconnect holder 62. In general, the flexible membrane 72 functions to physically attach the interconnect 20 to the interconnect holder 62. In addition, the flexible membrane 72 functions to provide electrical paths between the interconnect contacts 22 and the test circuitry 33 (FIG. 3) of the tester 26. The flexible membrane 72 can be formed of thin flexible materials to allow movement of the interconnect 20 in Z-directions. For example, the flexible membrane 72 can be formed of a flexible multi layered material similar to TAB tape.

In the illustrative embodiment, the flexible membrane 72 comprises a layer of polymer tape having metal conductors thereon. Bonded connections are formed between the conductors on the membrane 72 and corresponding conductors 74 on the interconnect holder 62. In addition, bonded connections are formed between the conductors on the membrane 72 and the bonding pads 44 on the interconnect 20.

Still referring to FIG. 3, the wafer prober 18 includes spring loaded electrical connectors 76 which are in electrical communication with the prober interface board 28. One type of spring loaded electrical connector 76 is manufactured by Pogo Industries of Kansas City, Mo. under the trademark "POGO PINS". The electrical connectors 76 electrically communicate with the conductors 74 on the interconnect holder 62.

The interconnect mounting arrangement shown in FIG. 3, as well as others, are described in U.S. patent application Ser. No. 08/797,719, now U.S. Pat. No. 6,060,891, entitled "PROBE CARD FOR SEMICONDUCTOR WAFERS AND METHOD AND SYSTEM FOR TESTING WAFERS", incorporated herein by reference. However, it is to be understood that these mounting arrangements are merely exemplary and the interconnect 20 can be mounted in a conventional manner on a commercially available wafer prober.

Test Method

Referring to FIG. 7, steps in a method for testing the substrate 10 using the test system 18 and interconnect 20 are illustrated. These steps are as follows.

1. Place contacts 22 on interconnect 20 in electrical communication with bumped component contacts 12 on components 11 (devices under test).
2. Test the components 11 in groups for opens and shorts by selectively actuating contacts 22 on the interconnect 20 up to limit of tester resources.
3. Disable defective components 11 by selectively actuating contacts 22 on the interconnect 20.
4. Write test signals from tester 26 to multiple components 11 by multiplexing input test signals to selected contacts 22 and bumped component contacts 12 on multiple components 11 at the same time.
5. Read test signals from multiple components 11 in groups up to limit of tester resources, while maintaining device uniqueness and ability to disconnect defective components 11.

Multiplex Circuit

Figure 8A:
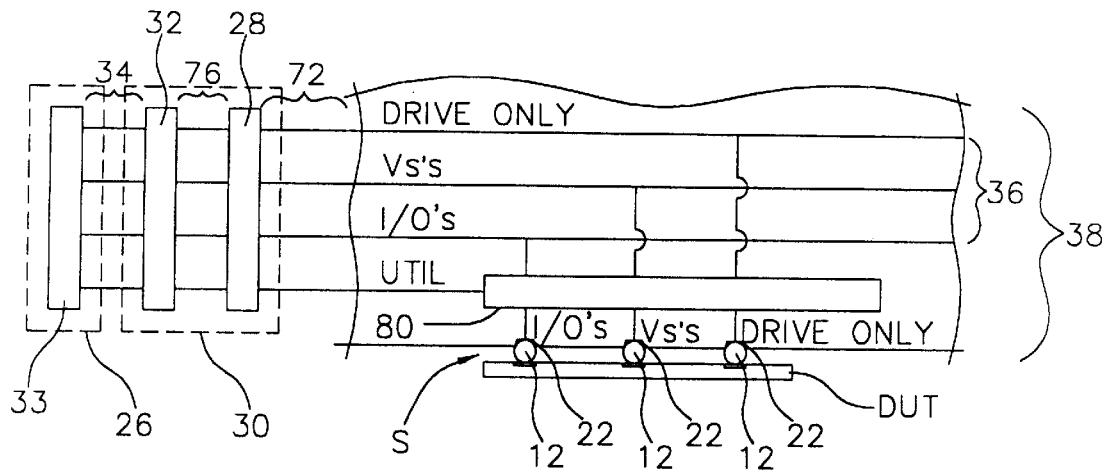
FIG. 8A is a schematic electrical diagram of on board circuitry and a test site contained on the interconnect and the electrical interface of the interconnect and tester.

Referring to FIGS. 8A–8D, further details of the on board circuitry 38 (FIG. 4) are illustrated. In FIG. 8A, a single test site S is illustrated. The test site S on the interconnect 20 includes a pattern of interconnect contacts 22 which are configured to electrically engage bumped component contacts 12 on the component 11 being tested, which is termed the "device under test" (DUT). As previously described, the interconnect 20 is in electrical communication with the interconnect holder 62, the tester pin electronics 32, and the test circuitry 33 within the tester 26.

As shown in FIG. 8A, the on board circuitry 38 includes a multiplex circuit 80. The multiplex circuit 80 is configured to receive test signals from the test circuitry 33 and to fan out or multiply the test signals. In addition, the multiplex circuit 80 is configured to selectively address the fanned out test signals through the interconnect contacts 22 to selected bumped component contacts 12 on the DUT. Stated differently, the multiplex circuit permits the test signals to be fanned out, allowing test procedures to be conducted in parallel. At the same time, the multiplex circuit 80 is configured to maintain the uniqueness of individual DUTs, and to electrically disconnect defective DUTs as required.

As shown in FIG. 8A, the multiplex circuit 80 includes a Util channel for each DUT, which functions as a control channel. In addition to the Util channel, the multiplex circuit 80 includes drive only channels, Vs channels, and I/O channels. The numbers of the channels are determined by the tester resources. Table I lists the tester resources of a Model "J993" tester 26 manufactured by Teradyne.

TABLE I

Tester Resources of Teradyne "J993" Tester

- 16 power supply channels per test head (30)
- 16X, 16Y address generation channels per test head (30)
- 16 DUTs can be tested in parallel per test head (30)
- 72 I/O channels per test head (30)
- 2 heads (30) per tester (26)
- 320 drive only channels per head (30) divisible as follows:
    - 80 per test site (S) with 4 test sites (S0–S3)
    - 40 per test site (S) with 8 test sites (S0–S7)
    - 20 per test site (S) with 16 test sites (S0–S15)
- Up to 320 megabits of catch RAM
- 36 Util channels per test head (30)

Table II lists the tester resources of a Model "J994" tester 26 manufactured by Teradyne.

TABLE II

Tester Resources of Teradyne "J994" Tester

- 32 power supply channels per test head (30)
- 16X, 16Y address generation channels per test head (30)
- 32 DUTs can be tested in parallel per test head (30)
- 144 I/O channels per test head (30)
- 2 heads (30) per tester (26)
- 640 drive only channels per head 30 divisible as follows:
    - 80 per test site (S) with 8 test sites (S1–S8)
    - 40 per test site (S) with 16 test sites (S1–S16)
    - 20 per test site (S) with 32 test sites (S1–S32)
- Up to 640 megabits of catch RAM
- 52 Util channels per test head (30)

Table III lists the test requirements for one type of SRAM.

TABLE III

Sample SRAM Requirements For Each Device Under Test DUT

- 36 I/O channels per DUT
- 18 address channels (drive only) per DUT
- 32 control channels (drive only) per DUT
- 6 power supply channels (Vs-voltage supplies) per DUT
- Util channels used depends on parallelism
- Total
    - 36 I/O channels per DUT
    - 50 drive only channels per DUT
    - 6 Vs channels per DUT With these sample requirements, a "J993" tester 26 can test two DUTs per test head 30, due to the I/O requirements. This is shown schematically in FIG. 8C. In FIG. 8C, the (J993) tester 26 includes a first test head 30-0 and a second test head 30-1. Each test head 30-0, 30-1, is capable of testing two DUTs, for a total of four at a time. Following testing of these four DUTs, both substrates 10 (one on each test head) can be stepped such that the bumped component contacts 12 on four additional DUTs align with the interconnect contacts 22 for testing.

A "J994" tester 26 has twice the tester resources of a "J993" tester 26. Accordingly, on the basis of the above sample I/O requirements, a "J994" tester 26 can test four DUTs per test head 30, for a total of eight at a time.

Figure 8B:
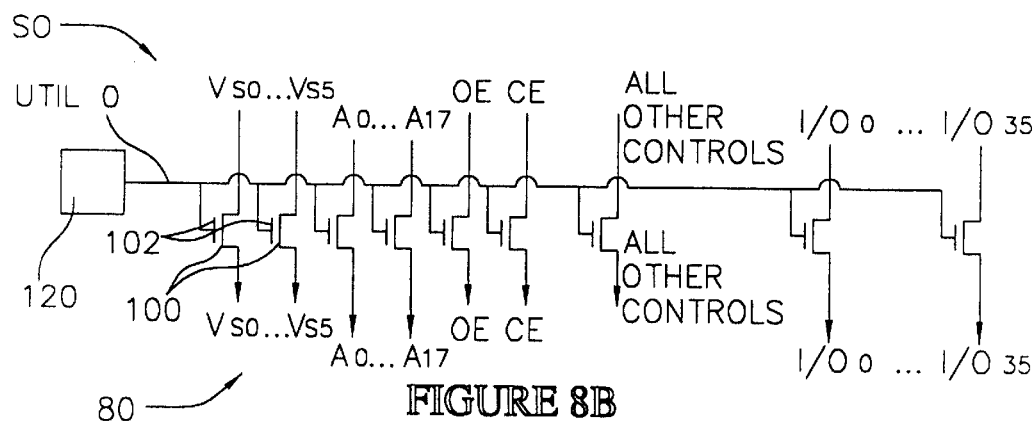
FIG. 8B is a schematic electrical diagram of a multiplex circuit of the on board circuitry.
Figure 8C:
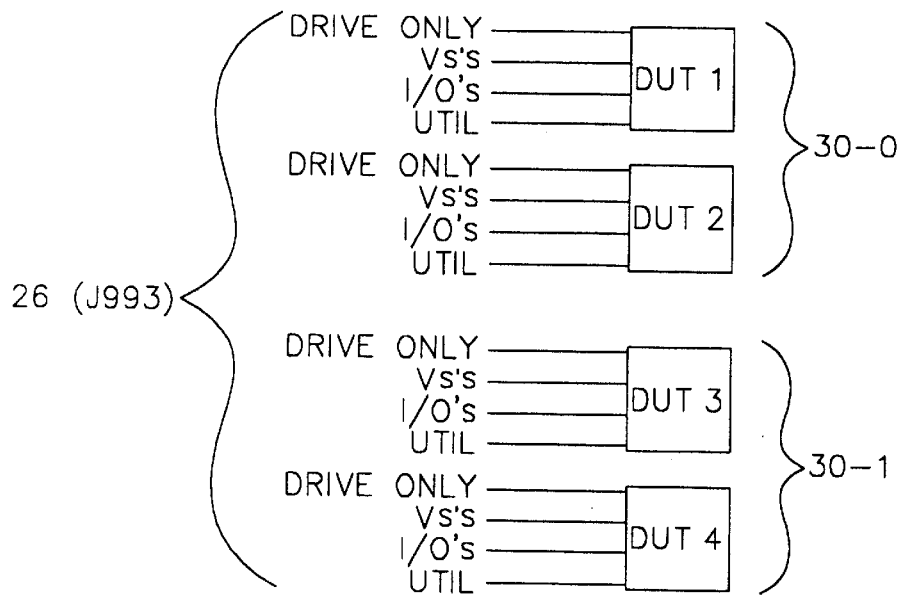
FIG. 8C is a schematic electrical diagram illustrating a test operation for a tester with a prior art interconnect.

Referring to FIG. 8B, a single test site S0 of the multiplex circuit 80 is illustrated. The multiplex circuit 80, simply stated, comprises multiple FET transistors 100 configured to provide a switching circuit for selectively enabling and disabling the interconnect contacts 22. The gate 102 of each FET transistor 100 is in electrical communication with the Util 0 channel. A controller 120 (or computer) generates control signals which are transmitted through the Util 0 channel to the FET transistors 100.

In the illustrative embodiment, the multiplex circuit 80 is configured to test the SRAM of Table III. Accordingly, there are six Vs channels (Vs0 ... Vs5), eighteen address channels (A0 ... A17), and thirty six I/O channels (I/O0-I/O35). In addition, there is an OE channel, a CE channel, and an "all other controls" channel. With this arrangement test signals can be transmitted from the test circuitry 33 and latched by the channels. Control signals from the controller 120 then control the FET transistors 100 to enable and disable the contacts 22 to selectively transmit the test signals to the bumped component contacts 12 as required.

During the test mode the uniqueness of each DUT is maintained. In addition, the control signals can be used to operate the FET transistors 100 to disable selected contacts 22 in order to electrically disconnect defective DUTs. Still further, the control signals can be used to operate the FET transistors 100 to enable and disable selected contacts 22 in the transmission of "read" signals from the DUTs. However, in the "read" mode the DUTs must be read in accordance with the tester resources.

As is apparent, the multiplex circuit 80 illustrated in FIG. 8B is merely exemplary. Those skilled in the art, with the aid of the present specification, can design other multiplex circuits able to multiply and selectively address test signals from a tester. Thus other types of multiplexing circuits are intended to be included within the scope of the present claims.

Figure 8D:
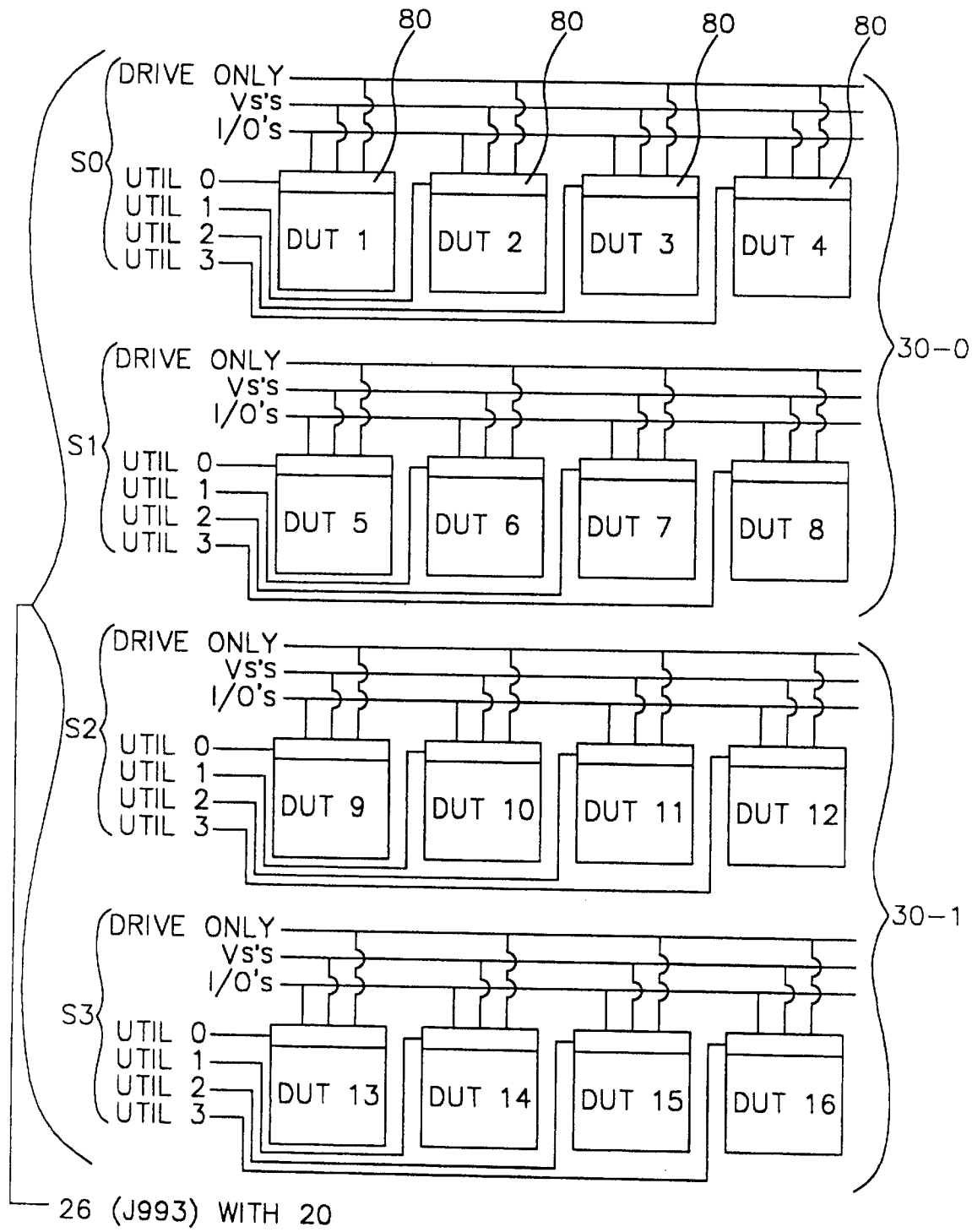
FIG. 8D is a schematic electrical diagram illustrating a test operation for the tester of FIG. 8C but with a interconnect and multiplex circuit constructed in accordance with the invention.

Referring to FIG. 8D, the operation of the J993 tester 26 of Table I, outfitted with the interconnect 20 having the multiplex circuit 80 is illustrated. In this example there are four test sites S0, S1, S2, S4 contained in two test heads 30-0, 30-1. Using the multiplex circuit each test site can write test signals to four DUTs at a time. In the "read" mode the additional three DUTs per test site must be selected in accordance with tester resources (e.g., one at a time or two at a time).

A limiting factor in the number of DUTs that can be tested by each test site is the drive current capacity of the channels of the tester 26. On the J993 and J994 testers 26, the drive current capacity is about 50 mA per channel. In addition, the test signals can be specified with a current (IOL) of about 8 mA per channel. Thus with some margin, each I/O channel and drive only channel of the tester 26 can be configured to drive four DUTs substantially as shown in FIG. 8D. During a write operation there is 8 mA per DUTx4 DUTs=32 mA per tester drive only channel. This leaves a 18 mA per channel margin.

Thus the invention provides an improved interconnect for testing semiconductor components contained on a substrate, a method for testing semiconductor components using the interconnect, and a test system employing the interconnect. The interconnect can include interconnect contacts in dense arrays to accommodate testing of multiple components having dense arrays of component contacts. In addition, the interconnect includes on board circuitry configured to expand tester resources.

While the invention has been described with reference to certain preferred embodiments, as will be apparent to those skilled in the art, certain changes and modifications can be made without departing from the scope of the invention as defined by the following claims.

What is claimed is:

1. A test system for testing semiconductor components having a plurality of bumped contacts comprising:
   a tester configured to transmit test signals to the components and to analyze resultant signals;
   an interconnect comprising a plurality of interconnect contacts in electrical communication with the tester and configured to electrically engage the bumped contacts; and
   a multiplex circuit on the interconnect in electrical communication with the interconnect contacts, the circuit configured to fan out the test signals from the tester, and to control the interconnect contacts to selectively transmit the test signals to the bumped contacts or to selectively read the resultant signals.

2. The test system of claim 1 further comprising a wafer prober configured to support the interconnect and to align and move the components into contact with the interconnect.

3. The test system of claim 1 wherein the interconnect contacts comprise conductive pockets.

4. The test system of claim 1 wherein the interconnect contacts comprise projections or edges configured to penetrate the bumped contacts.

5. The test system of claim 1 wherein the interconnect comprises a semiconductor material and the multiplex circuit comprises active electrical switching devices in the material.

6. The test system of claim 1 wherein the multiplex circuit comprises a die flip chip mounted to the interconnect.

7. A test system for testing semiconductor components comprising integrated circuits and a plurality of bumped contacts in electrical communication with the integrated circuits, the system comprising:
   a tester configured to transmit test signals to the integrated circuits;
   an interconnect comprising a plurality of interconnect contacts in electrical communication with the tester configured to electrically engage the bumped contacts; and
   a multiplex circuit on the interconnect in electrical communication with the interconnect contacts and configured to multiply the test signals;
   the multiplex circuit comprising a plurality of active electrical switching devices, each of the devices in electrical communication with an interconnect contact and operable by control signals to selectively enable and disable the interconnect contact, to allow the test signals to be selectively transmitted to the integrated circuits.

8. The test system of claim 7 wherein the interconnect contacts comprise conductive pockets.

9. The test system of claim 7 wherein the components are contained on a substrate.

10. The test system of claim 7 wherein the interconnect contacts comprise conductive pockets having projections therein configured to penetrate the bumped contacts.

11. The test system of claim 7 wherein the interconnect contacts comprise projections or edges for penetrating the bumped contacts.

12. The test system of claim 7 wherein the components comprise semiconductor packages.

13. The test system of claim 7 wherein the interconnect comprises a semiconductor material and the multiplex circuit comprises a plurality of active electrical switching devices fabricated therein.

14. The test system of claim 7 wherein the multiplex circuit comprises a semiconductor die on the interconnect.

15. The test system of claim 7 wherein the multiplex circuit comprises a bumped semiconductor die flip chip mounted to the interconnect.

16. A test system for testing semiconductor components on a substrate having a plurality of bumped contacts comprising:
   a tester configured to transmit test signals to the components and to analyze resultant test signals;
   an interconnect comprising a plurality of interconnect contacts in electrical communication the tester configured to electrically engage the bumped contacts; and
   a multiplex circuit on the interconnect in electrical communication with the interconnect contacts, the circuit configured to fan out the test signals from the tester to a selected group of components on the substrate and to read the resultant test signals from the selected group.

17. The test system of claim 16 wherein the components comprise semiconductor dice and the substrate comprises a semiconductor wafer.

18. The test system of claim 16 wherein the components comprise semiconductor packages and the substrate comprises a panel or a leadframe.

19. The test system of claim 16 wherein the interconnect contacts comprise conductive pockets configured to retain the bumped contacts.

20. The test system of claim 16 wherein the interconnect contacts comprise projections or edges configured to penetrate the bumped contacts.

21. A test system for testing semiconductor components on a substrate having a plurality of bumped contacts comprising:
   a tester configured to transmit write test signals to the components and to receive read test signals from the components, the tester having a signal writing capability and a signal reading capability;
   an interconnect comprising a plurality of interconnect contacts in electrical communication with the tester configured to electrically engage the bumped contacts; and a multiplex circuit on the interconnect in electrical communication with and configured to control the interconnect contacts, the circuit configured to expand the signal writing capability by multiplexing the write test signals to a selected group of interconnect contacts, and to read the read test signals from the selected group up to the signal reading capability.

22. The test system of claim 21 wherein the bumped contacts comprise solder balls and the interconnect contacts comprise conductive pockets configured to retain the solder balls.

23. The test system of claim 21 wherein the components comprise semiconductor dice on a wafer.

24. The test system of claim 21 wherein the components comprise semiconductor packages on a panel or leadframe.

25. The test system of claim 21 wherein the interconnect comprises a semiconductor material and the multiplex circuit comprises devices in the material.

26. The test system of claim 21 wherein the multiplex circuit comprises a semiconductor die on the interconnect.

* * * * *

UNITED STATES PATENT AND TRADEMARK OFFICE
CERTIFICATE OF CORRECTION

PATENT NO.     : 6,466,047 B1
DATED          : October 15, 2002
INVENTOR(S)    : C. Patrick Doherty and Jorge L. deVarona It is certified that error appears in the above-identified patent and that said Letters Patent is hereby corrected as shown below:

<u>Column 14,</u>
Line 38, after "communication add -- with --.

Signed and Sealed this

Twenty-first Day of January, 2003

JAMES E. ROGAN
*Director of the United States Patent and Trademark Office*